United States Patent
Choi

(10) Patent No.: US 9,466,649 B2
(45) Date of Patent: Oct. 11, 2016

(54) ORGANIC LIGHT EMITTING DIODE DISPLAY

(71) Applicant: SAMSUNG DISPLAY CO., LTD., Yongin, Gyeonggi-Do (KR)

(72) Inventor: Kyung Hyun Choi, Cheonan-si (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 0 days.

(21) Appl. No.: 14/449,429

(22) Filed: Aug. 1, 2014

(65) Prior Publication Data
US 2015/0102314 A1    Apr. 16, 2015

(30) Foreign Application Priority Data
Oct. 11, 2013   (KR) .................. 10-2013-0121470

(51) Int. Cl.
*H01L 27/32* (2006.01)
*H01L 51/52* (2006.01)

(52) U.S. Cl.
CPC ....... *H01L 27/3246* (2013.01); *H01L 51/5253* (2013.01)

(58) Field of Classification Search
CPC .......... H01L 27/3246; H01L 27/3248; H01L 27/32; H01L 27/3202; H01L 27/3204; H01L 27/3206; H01L 27/3225; H01L 27/3244
See application file for complete search history.

(56) References Cited

U.S. PATENT DOCUMENTS

| 2009/0224664 A1* | 9/2009 | Yoshida | H01L 27/3246 313/504 |
|---|---|---|---|
| 2012/0032174 A1* | 2/2012 | Katsuhara | 257/59 |
| 2013/0341659 A1* | 12/2013 | Lin et al. | 257/91 |
| 2014/0197385 A1* | 7/2014 | Madigan | 257/40 |

FOREIGN PATENT DOCUMENTS

| JP | 2012-078746 A | 4/2012 |
|---|---|---|
| KR | 10-2005-0122697 A | 12/2005 |
| KR | 10-2006-0082126 A | 7/2006 |
| KR | 10-2008-0000791 A | 1/2008 |

OTHER PUBLICATIONS

Machine translation of JP 2012-078746A.*

* cited by examiner

*Primary Examiner* — Ha Tran T Nguyen
*Assistant Examiner* — Suberr Chi
(74) *Attorney, Agent, or Firm* — Lee & Morse P.C.

(57) ABSTRACT

An organic light emitting diode display is provided including: a substrate including a display area and a non-display area positioned at a circumference of the display area; a thin film transistor formed on the substrate; a first electrode formed on the thin film transistor and electrically connected to the thin film transistor; a pixel definition layer formed on the first electrode and defining a pixel area; and an emission layer formed on the first electrode and contacting the first electrode in the pixel area, wherein the display area is divided into a first region, and a second region including a remainder of the display area except for the first region, and a cross-sectional area ratio of the pixel definition layer that a cross-section of the pixel definition layer occupies for a unit pixel is different in the first region and the second region.

13 Claims, 8 Drawing Sheets

ORGANIC LIGHT EMITTING DIODE DISPLAY

CROSS-REFERENCE TO RELATED APPLICATION

Korean Patent Application No. 10-2013-0121470, filed on Oct. 11, 2013, in the Korean Intellectual Property Office, and entitled: "Organic Light Emitting Diode Display," is incorporated by reference herein in its entirety.

BACKGROUND

1. Field

The present disclosure relates to an organic light emitting diode display.

2. Description of the Related Art

Currently popular display devices include liquid crystal displays (LCDs), plasma display devices (PDPs), organic light emitting displays (OLEDs), field effect displays (FEDs), and electrophoretic displays (EPDs).

In particular, the OLED displays may include two electrodes and an organic emission layer disposed therebetween. Electrons from one electrode and holes from the other electrode may combine in the organic emission layer to thereby form excitons, which release energy to emit light.

An organic light emitting diode display is self-luminous, and because the organic light emitting diode display does not need a separate light source, unlike a liquid crystal display, it can have a relatively small thickness and weight. Further, the OLED display may exhibit high-quality characteristics such as low power consumption, high luminance, and fast response speed, and thus has received attention as a next generation display device.

SUMMARY

An organic light emitting diode display according to an exemplary embodiment may include: a substrate including a display area displaying an image and a non-display area positioned at a circumference of the display area; a thin film transistor formed on the substrate; a first electrode formed on the thin film transistor and electrically connected to the thin film transistor; a pixel definition layer formed on the first electrode and defining a pixel area; and an emission layer formed on the first electrode and contacting the first electrode in the pixel area. The display area may be divided into a first region from a boundary of the display area and the non-display area to a first distance and a second region including a remainder of the display area except for the first region among the display area, and a cross-sectional area ratio of the pixel definition layer that a cross-sectional area of the pixel definition layer occupies for a unit pixel may be different in the first region and the second region.

The cross-sectional area ratio of the pixel definition layer of the first region may be greater than the cross-sectional area ratio of the pixel definition layer of the second region.

The cross-sectional area ratio of the pixel definition layer of the first region may be greater closer to the non-display area.

The first region may be divided into a first sub-region, a second sub-region, a third sub-region, and a fourth sub-region, which may each extend a second distance in a direction from the boundary of the first region and the second region to the non-display area.

The cross-sectional area ratio of the pixel definition layer may be greater closer to the fourth sub-region than to the first sub-region. The second distance may be about 5 mm.

The cross-sectional area ratio of the pixel definition layer of the first sub-region 1-1 may be about 29.5%.

The cross-sectional area ratio of the pixel definition layer of the second sub-region 1-2 may be about 30.5%.

The cross-sectional area ratio of the pixel definition layer of the third sub-region 1-3 may be about 31.5%.

The cross-sectional area ratio of the pixel definition layer of the fourth sub-region 1-4 may be about 32.5%.

The cross-sectional area ratio of the pixel definition layer of the first region may be in a range of about 29% to about 33%.

The cross-sectional area ratio of the pixel definition layer of the second region may be less than about 29%.

The first distance may be about 20 mm to about 40 mm.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
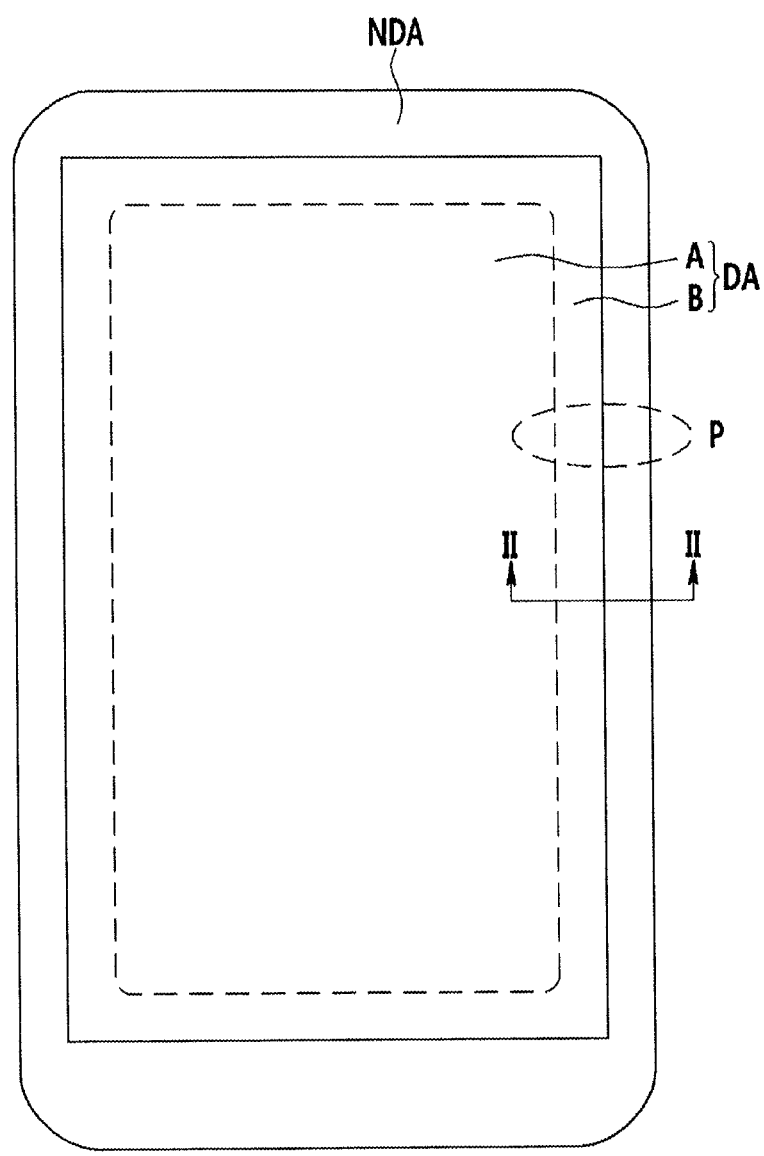
FIG. 1 illustrates a schematic top plan view of an organic light emitting diode display including a display area and a non-display area.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
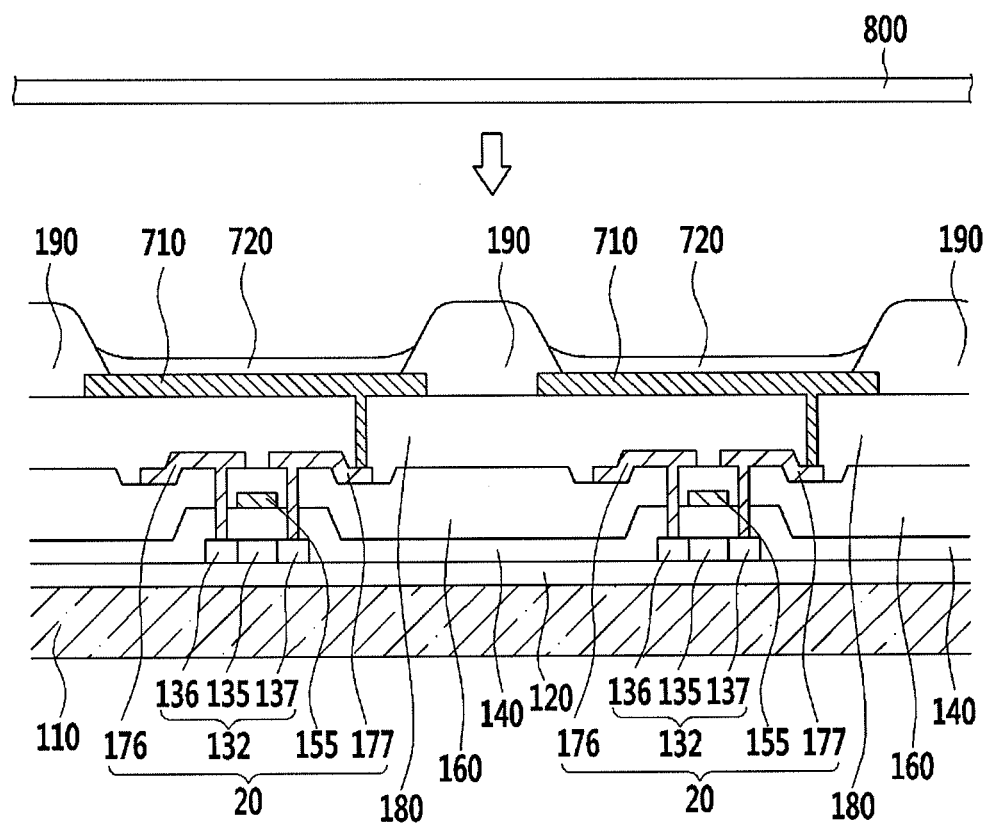
FIG. 2 illustrates a cross-sectional view taken along the line II-II of FIG. 1.

FIG. 1 illustrates a schematic top plan view of an organic light emitting diode display including a display area and a non-display area, and FIG. 2 illustrates a cross-sectional view taken along the line II-II of FIG. 1.

Referring to FIG. 1 and FIG. 2, in an organic light emitting diode display according to an exemplary embodiment, a pixel definition layer 190 may have a different cross-sectional area ratio between the pixel definition layer adjacent to an edge of a display area DA and the pixel definition layer positioned at a center of the display area. Accordingly, because an encapsulation layer 800 may be deposited on the pixel definition layer 190, flatness of the encapsulation layer 800 may be uniformly maintained. A detailed description thereof will be described below.

A structure of an organic light emitting diode display according to an exemplary embodiment will be described with reference to FIG. 1 and FIG. 2.

Referring to FIG. 1, the organic light emitting diode display is divided into a display area DA that may display an image, and a non-display area NDA that may be positioned at a circumference of the display area. A plurality of pixels may be disposed in the display area DA, and a driver driving the pixel may be positioned in the non-display area NDA.

Referring to FIG. 2, the organic light emitting diode display include a substrate 110, a thin film transistor 20, a first electrode 710, an organic emission layer 720, a second electrode (not shown), the pixel definition layer 190, and the encapsulation layer 800. Hereafter, when describing the thin film transistor, among a switching thin film transistor and a driving thin film transistor that are applied to the organic light emitting diode display, a driving transistor will primarily be described.

Referring to FIG. 2, the substrate 110 may be formed as an insulation panel formed of glass, quartz, ceramic, plastic, or the like. However, embodiment are not limited thereto, and the substrate 110 may also be formed as a metallic substrate formed of stainless steel or the like.

A buffer layer 120 may be formed on the substrate 110. The buffer layer 120 may prevent impurity elements from permeating and may planarize a surface of the substrate 110. The buffer layer 120 may be formed of various materials capable of performing the aforementioned functions.

A driving semiconductor layer 132 may be formed on the buffer layer 120. The driving semiconductor layer 132 may be formed of a polycrystalline silicon film. Further, the driving semiconductor layer 132 may include a channel area 135 on which an impurity is not doped, and a source area 136 and a drain area 137 formed by p+ doping on both sides of the channel area 135.

A gate insulating layer 140 may be formed on the driving semiconductor layer 132. The gate insulating layer 140 may be made of a silicon nitride (SiNx) or a silicon oxide ($SiO_x$).

A gate wire including a driving gate electrode 155 may be formed on the gate insulating layer 140. The driving gate electrode 155 may be formed to overlap at least a portion of the driving semiconductor layer 132. In exemplary embodiments, the driving gate electrode 155 may be formed to overlap the channel region 135.

An interlayer insulating layer 160 covering the driving gate electrode 155 may be formed on the gate insulating layer 140. The gate insulating layer 140 and the interlayer insulating layer 160 together have through-holes exposing the source region 136 and the drain region 137 of the driving semiconductor layer 132. The interlayer insulating layer 160, like the gate insulating layer 140, may be made of a ceramic-based material such as a silicon nitride (SiNx) or a silicon oxide ($SiO_x$).

A data wire including a driving source electrode 176 and a driving drain electrode 177 may be formed on the interlayer insulating layer 160. The driving source electrode 176 and the driving drain electrode 177 may be respectively connected to the source region 136 and the drain region 137 of the driving semiconductor layer 132 through the through-holes formed in the interlayer insulating layer 160 and the gate insulating layer 140.

As described above, the driving thin film transistor 20 including the driving semiconductor layer 132, the driving gate electrode 155, the driving source electrode 176, and the driving drain electrode 177 may be formed. The configuration of the driving thin film transistor 20 is not limited to the above-described configurations, and can be variously changed as can be realized by a person skilled in the art.

A planarization layer 180 that may cover the data wires 176 and 177 may be formed on the interlayer insulating layer 160. The planarization layer 180 may remove a stepped difference and flatten the surface in order to heighten the luminous efficiency of an organic light emitting element to be formed thereon. Furthermore, the planarization layer 180 may include an electrode contact hole partially exposing the drain electrode 177.

The first electrode of the organic light emitting element, that is, pixel electrode 710, may be formed on the planarization layer 180. The organic light emitting diode display may include a plurality of pixel electrodes 710 respectively disposed for a plurality of subpixels.

The plurality of pixel electrodes 710 may be separated from each other. One pixel electrode 710 may be disposed for each organic light emitting element. The pixel electrode 710 may be connected to the drain electrode 177 through the electrode contact hole 182 of the planarization layer 180.

The pixel defining layer 190 may have an opening that exposes the pixel electrode 710 and may be formed on the planarization layer 180. The pixel defining layer 190 may include a plurality of openings formed in each subpixel. The pixel electrode 710 may be disposed to correspond to the opening of the pixel definition layer 190.

The organic emission layer 720 may be formed on the pixel electrode 710 and the second electrode, that is, a common electrode (not shown), may be formed on the organic emission layer 720. As described above, the organic light emitting element including the pixel electrode 710, the organic emission layer 720, and the common electrode may be formed.

The organic emission layer 720 may be made of a low molecular weight organic material or a high molecular weight organic material. The organic emission layer 720 may be formed in a multi-layer structure including an emission layer and at least one of a hole injection layer (HIL), a hole transport layer (HTL), an emission layer, an electron transport layer (ETL), and an electron injection layer (EIL). When the organic emission layer 720 includes all the above layers, the hole injection layer (HIL) may be disposed on the pixel electrode 190 serving as an anode, and the hole transport layer (HTL), the emission layer, the electron transport layer (ETL), and the electron injection layer (EIL) may be sequentially laminated on the hole injection layer (HIL).

The organic emission layer 720 may be divided into colors such as red, green, and blue according to a material kind of the emission layer.

The pixel electrode 710 and the common electrode may be formed of a transparent conductive material or a semi-transparent or reflective conductive material. According to the kind of the material that forms the pixel electrode 710 and the common electrode, the organic light emitting diode (OLED) display may be a front surface light emitting type, a rear surface light emitting type, or a both-side light emitting type.

The encapsulation layer 800 may be positioned on the pixel definition layer 190. The common electrode (not shown) may be positioned between the encapsulation layer 800 and the pixel definition layer 190. The encapsulation layer 800 may be deposited on the pixel definition layer 190 to protect the organic emission layer 720 from oxygen or moisture that may infiltrate from the outside.

According to an exemplary embodiment, the pixel definition layer 190 on which the encapsulation layer 800 lies may have a cross-sectional area ratio that may be changed according to a position of the display area. In detail, the pixel definition layer 190 may have different cross-sectional area ratios for the pixel definition layer adjacent to the edge of the display area DA and the pixel definition layer positioned at the center of the display area. Hereafter, a configuration of the pixel definition layer 190 of the organic light emitting diode display according to an exemplary embodiment will be described.

Figure 3:
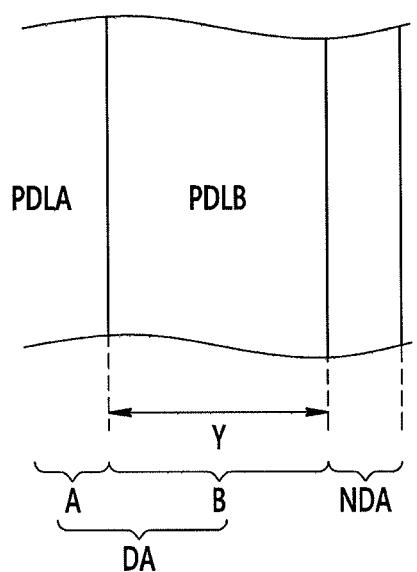
FIG. 3 illustrates an exemplary embodiment of a pixel definition layer of an enlarged region P of FIG. 1.

Referring to FIG. 1 and FIG. 3, the display area DA may be divided into a first region B and a second region A. The first region B may be defined as a region from a boundary of the display area DA and the non-display area NDA inwardly by a first distance Y. The second region A may be defined as a region in the display area DA, except for the first region B in the display area DA.

According to an exemplary embodiment, the cross-sectional area ratio of the pixel definition layer PDLB of the first region B may be larger than the cross-sectional area ratio of the pixel definition layer PDLA of the second region A. The cross-sectional area ratio may be defined as a ratio of the cross-sectional area of the pixel definition layer to the entire cross-sectional area of the unit pixel. In addition, the cross-sectional area of the pixel definition layer may be the cross-sectional area of the pixel definition layer that contacts the encapsulation layer 800.

That is, the cross sectional area that the pixel definition layer in the first region B occupies in the unit pixel maybe greater than the cross sectional area that the pixel definition layer occupies in the unit pixel in the second region A. Referring to FIG. 1 and FIG. 3, for the pixel definition layer formed in the display area DA, the cross-sectional area ratio of the pixel definition layer PDLB in the first region B corresponding to an outer part of the display area DA may be higher than the cross-sectional area ratio of the pixel definition layer PDLA of the second region A corresponding to an inner part of the display area DA.

According to an exemplary embodiment, the cross-sectional area ratio of the pixel definition layer 190 of the first region B may be in a range of about 29% to about 33%. For example, the pixel definition layer 190 of the first region B may be uniformly formed with a predetermined cross sectional area ratio in the range of the above cross-sectional area ratio range. In exemplary embodiments, the cross-sectional area ratio of the pixel definition layer 190 of the second region A may be less than about 29%.

However, the cross-sectional area ratio of the pixel definition layer of the first and second regions is not limited, and various cross-sectional area ratios in which the cross-sectional area ratio of the pixel definition layer 190 may be higher in the first region B as compared with the second region A are possible.

The first distance Y corresponding to the width of the first region B from the boundary of the display area DA and the non-display area NDA may be in a range of about 20 mm to about 40 mm.

As described above, in the process of depositing the encapsulation layer 800 onto the pixel definition layer 190, disposing the pixel definition layer 190 having the different cross-sectional area ratio depending on the position in the display area DA may reduce or prevent uniform flatness of the encapsulation layer 800, as the height of the pixel definition layer 190 at the outer part of the display area DA may be lower than that in the inner part thereof. This will be described with reference to FIG. 9.

Figure 9A:
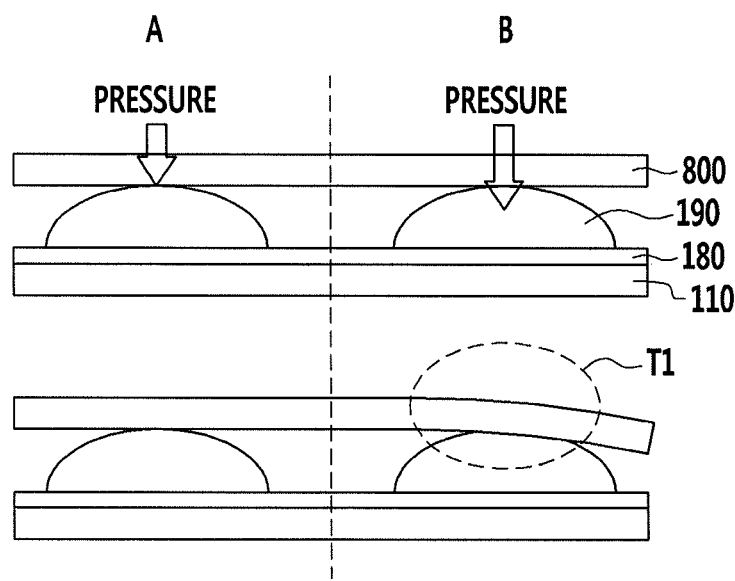
FIGS. 9A and 9B illustrate a process in which flatness of an encapsulation layer is changed in a process of depositing an encapsulation layer on a pixel definition layer.

Referring to FIG. 9A, in the process of adhering the encapsulation layer 800 on the pixel definition layer 190, higher pressure may be applied in the first region B at the outer portion as compared with the second region A. Accordingly, the height of the pixel definition layer 190 of the first region B, where the relatively higher pressure is applied, may be less than the height of the pixel definition layer 19 in the second region A. As a result, the height of the encapsulation layer 800 positioned on the pixel definition layer 190 may be less in the first region B (referring to T1).

As described above, because the height of the pixel definition layer 190 may be decreased in the first region B of the display area DA, the cross-sectional area ratio of the pixel definition layer 190 of the first region B may be greater than the cross-sectional area ratio of the pixel definition layer 190 in the second region A, thereby reducing or preventing non-uniformity of the encapsulation layer 800.

Figure 9B:
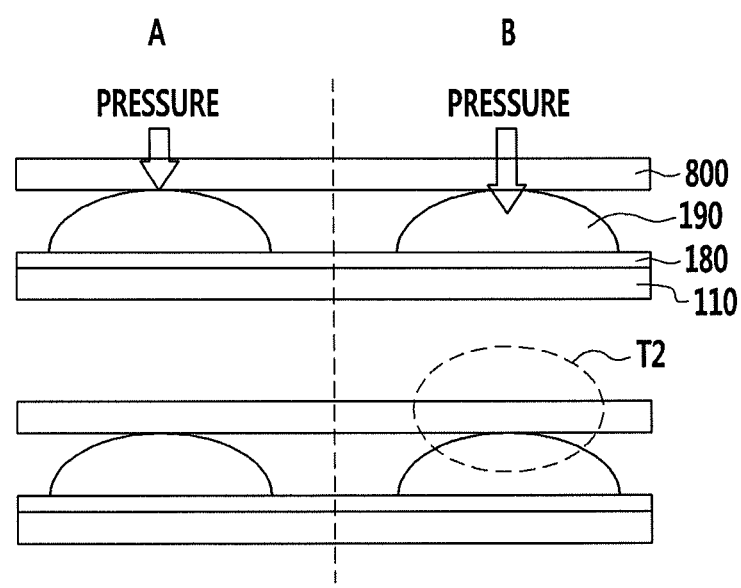

Referring to FIG. 9B, by forming the pixel definition layer 190 to have a higher cross-sectional area ratio in the first region B than in the second region A, although the relatively higher pressure may be applied to the pixel definition layer 190 in the first region B, the flatness of the encapsulation layer 800 may be uniformly maintained.

Figure 5:
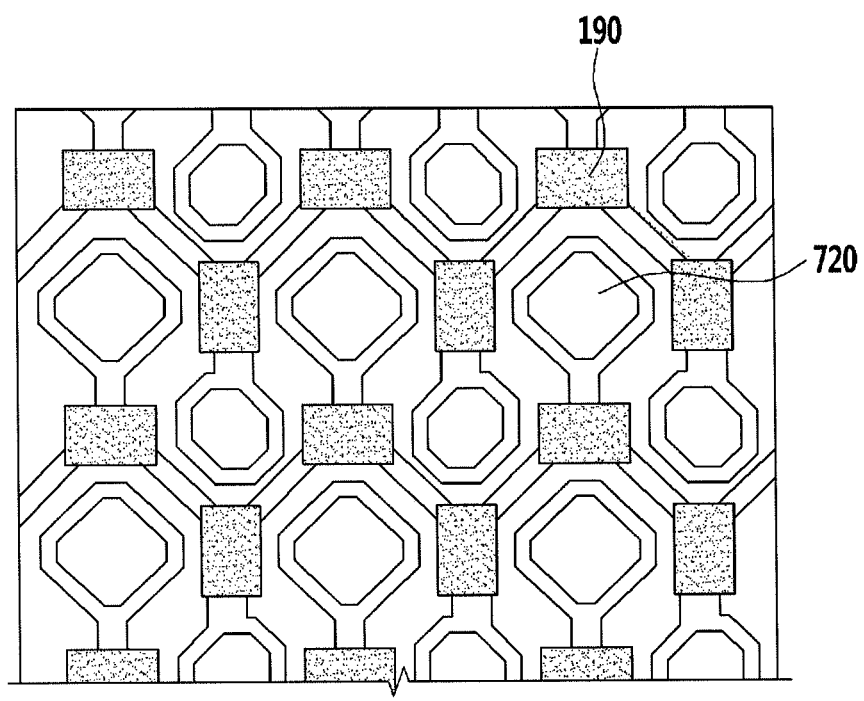
FIG. 5 to FIG. 7 illustrate top plan views of various cross-sectional shapes of a pixel definition layer.
Figure 6:
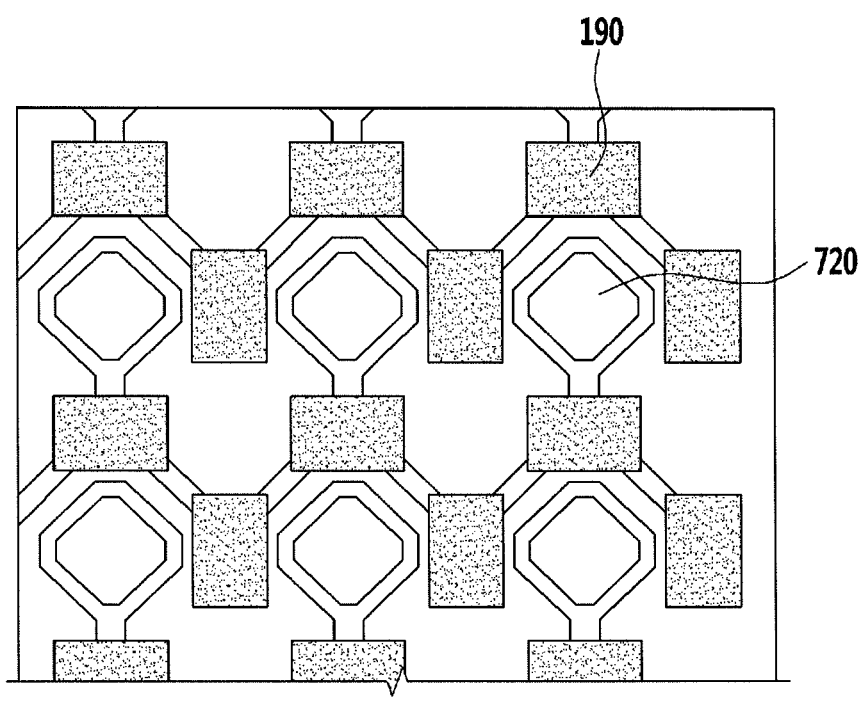
Figure 7:
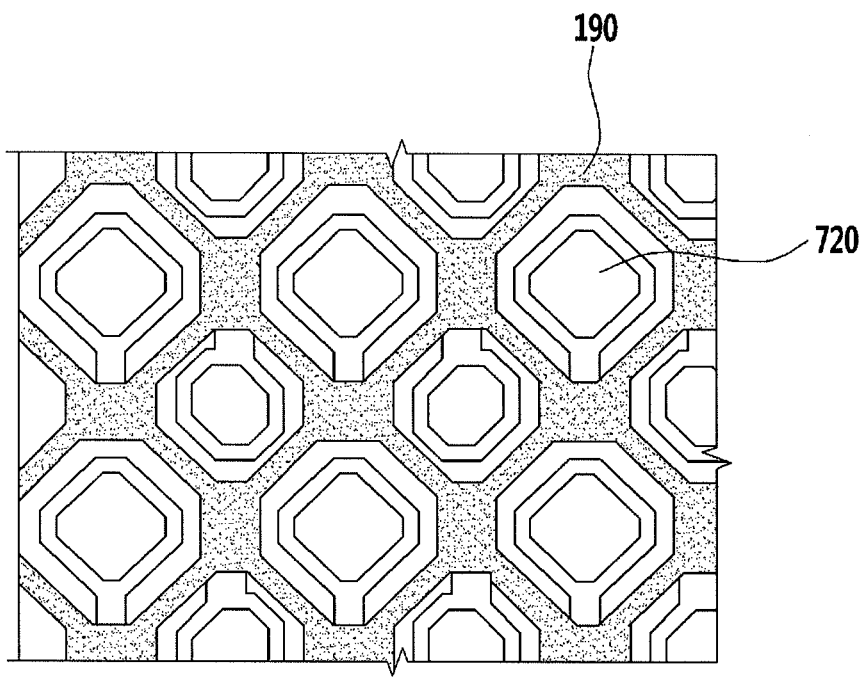

To form the different cross-sectional area ratios of the pixel definition layer 190 in the first region B and the second region A, the cross-section of various shapes may be formed as shown in FIG. 5 to FIG. 7.

Referring to FIG. 5 and FIG. 6, by enlarging a size of the cross-section of each pixel definition layer 190 positioned in each pixel, the cross-sectional area ratio of the pixel definition layer 190 may be increased. That is, as shown in FIG. 5 and FIG. 6, by increasing the size of the cross-sectional area of the pixel definition layer 190 near the organic emission layer 720, the cross-sectional area ratio of the pixel definition layer 190 may be increased.

Referring to FIG. 7, by interconnecting the pixel definition layer 190 near the organic emission layer 720, the cross-sectional area of the pixel definition layer 190 contacting the encapsulation layer 800 may be increased.

Figure 8:
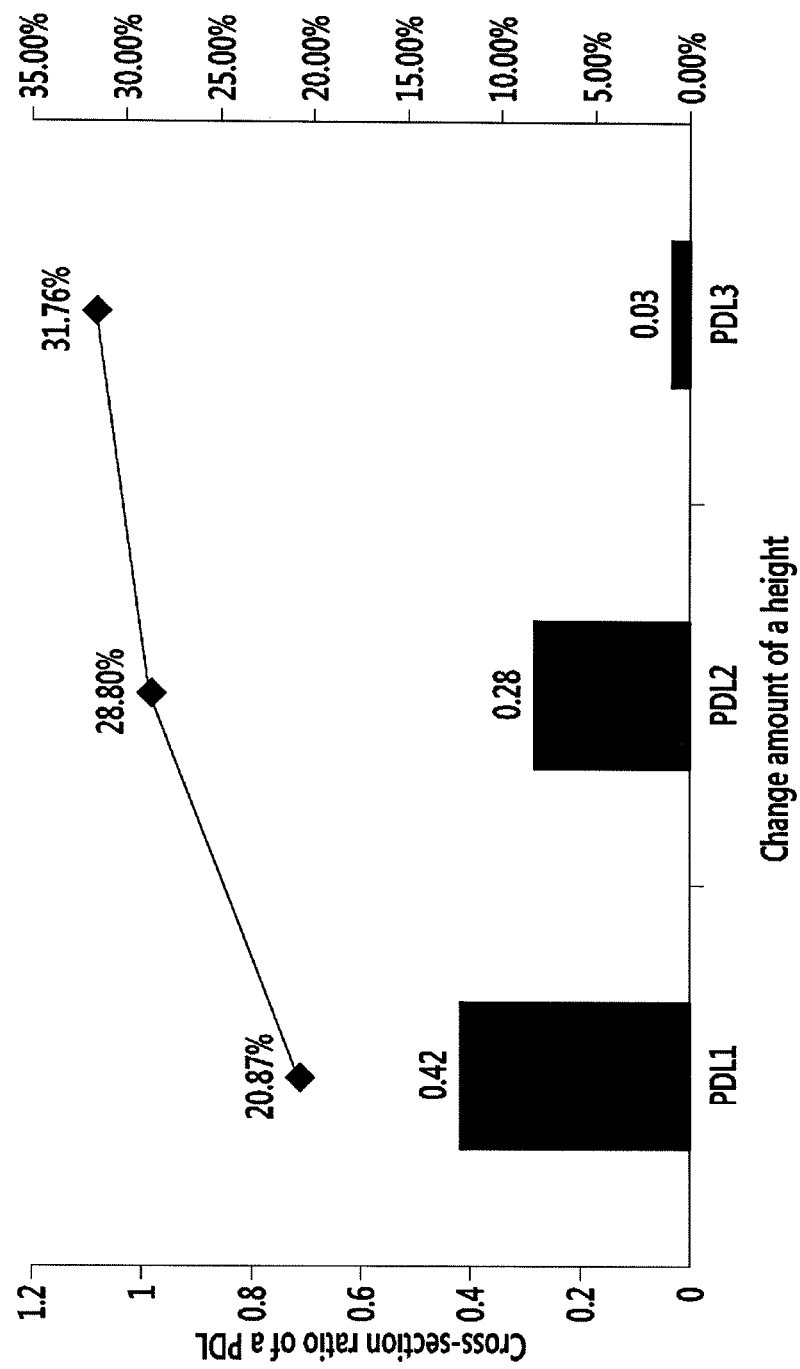
FIG. 8 illustrates a graph showing a height change amount according to a cross-sectional area ratio of a pixel definition layer.

Referring to FIG. 8, a height change amount versus a cross-sectional area ratio of the pixel definition layer is shown. FIG. 8 illustrates the results of measuring a height change amount of the pixel definition layer by depositing the encapsulation layer and differentiating the cross-sectional area ratio of the pixel definition layer.

For example, when the cross-sectional area ratio of the pixel definition layer PDL1, the cross-sectional area ratio of the pixel definition layer PDL2, and the cross-sectional area ratio of the pixel definition layer PDL3 are respectively about 20.87%, 28.80%, and 31.76%, the height change amounts of the pixel definition layers PDL1, PDL2, and PDL3 are respectively about 0.42 µm, 0.28 µm, and 0.03 µm. As shown in FIG. 8, as the cross-sectional area ratio of the pixel definition layer is increased, the height change amount of the pixel definition layer is decreased.

According to another exemplary embodiment, the cross-sectional area ratio of the pixel definition layer 190 of the first region B may be increased closer to the non-display area NDA.

Figure 4:
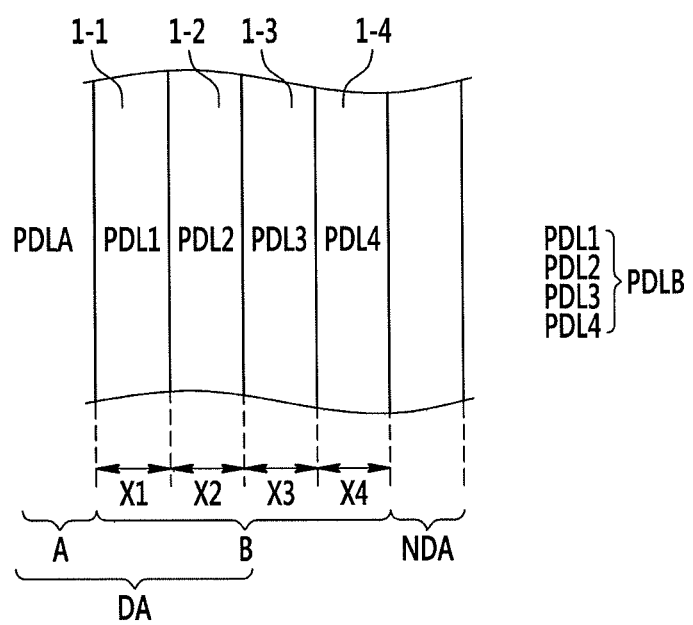
FIG. 4 illustrates another exemplary embodiment of a pixel definition layer of an enlarged region P of FIG. 1.

Referring to FIG. 4, the first region B may be divided into a first sub-region 1-1 that includes the pixel definition layer PDL1, a second sub-region 1-2 that includes the pixel definition layer PDL2, a third sub-region 1-3 that includes the pixel definition layer PDL3, and a fourth sub-region 1-4 that includes the pixel definition layer PDL4. The first sub-region 1-1 to the fourth sub-region 1-4 are defined at a region separated respectively from second distances (X1, X2, X3, and X4) from the boundary of the first region B and the second region A.

The second distances (X1, X2, X3, and X4) may be the same. For example, the second distances (X1, X2, X3, and X4) may be about 5 mm. However, the second distances are not limited to thereto, and may be various distances according to the size of the display device.

According to another exemplary embodiment, the cross-sectional area ratio of the pixel definition layer may be increased closer to the fourth sub-region 1-4 than the first sub-region 1-1. That is, comparing the cross-sectional area ratios of the pixel definition layer PDL1 of the first sub-region 1-1, the pixel definition layer PDL2 of the second sub-region 1-2, the pixel definition layer PDL3 of the third sub-region 1-3, and the pixel definition layer PDL4 of the fourth sub-region 1-4, the cross-sectional area ratio of the pixel definition layer PDL1 may be less than the cross-sectional area ratio of the pixel definition layer PDL2, which may less than the cross-sectional area ratio of the pixel definition layer PDL3 which may be less than the cross-sectional area ratio of the pixel definition layer PDL4.

The number of regions having the different cross-sectional area ratios is four in the first region B, however embodiments are not limited thereto, and the first region B may be divided into a plurality of regions, such as two regions or three regions.

In FIG. 4, the cross-sectional area ratios of the pixel definition layers PDL1, PDL2, PDL3, and PDL4 may be about 29.5%, 30.5%, 31.5%, and 32.5%, respectively. However, the cross-sectional area ratio of each pixel definition layer is not limited thereto, and may exhibit various cross sectional area ratios in the range of about 29% to about 33%.

By way of summation and review, an organic emission layer in an organic light-emitting display may be degraded due to external factors such as external moisture, oxygen, or ultraviolet rays, and thus packaging technology for sealing the organic emission layer may be very important.

Among techniques for sealing the organic emission layer, a structure covering and protecting the organic emission layer by an encapsulation layer may be used. The encapsulation layer may be disposed on a pixel definition layer formed at a circumference of the organic emission layer.

However, in the process of depositing the encapsulation layer onto the pixel definition layer, the pixel definition layer positioned at the edge of the display area of the display panel may receive more pressure than at the center of the display area. Accordingly, a height of the pixel definition layer at the edge of the display area may be lower than the height of the pixel definition layer at the center of the display area, thereby generating non-uniformity of flatness of the encapsulation layer.

In contrast, in the organic light emitting diode display according to an exemplary embodiment, the cross-sectional area ratio of the pixel definition layer of the display area may be different depending on its position in the display area such that the height of the pixel definition layer may be uniformly maintained in the process of depositing the encapsulation layer on the pixel definition layer.

An exemplary embodiment provides an organic light emitting diode display having uniform flatness of an encapsulation layer by uniformly maintaining a height of a pixel definition layer of an edge of a display area and a height of the pixel definition layer of a center of the display area in a process of depositing the encapsulation layer on the pixel definition layer.

According to an exemplary embodiment, in a process of depositing the encapsulation layer to the pixel definition layer, the height of the pixel definition layer inside the display area may be maintained such that flatness of the encapsulation layer in the organic light emitting diode display may be uniformly maintained.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

| <Description of Symbols> | |
|---|---|
| DA display area | NDA non-display area |
| A second region | B first region |
| 20 thin film transistor | 110 substrate |
| 190 pixel definition layer | 710 first electrode |
| 800 encapsulation layer | |

What is claimed is:

1. An organic light emitting diode display comprising:
a substrate including a display area having a plurality of pixels disposed to display images, and a non-display area positioned around the plurality of pixels of the display area and disposed along the edge of the substrate, a driver to drive the pixels being located in the non-display area;
a thin film transistor on the substrate;
a first electrode on the thin film transistor and electrically connected to the thin film transistor;
a pixel definition layer on the first electrode and defining a pixel area; and
an emission layer on the first electrode and contacting the first electrode in the pixel area,
wherein the display area is divided into
a first region from a boundary of the display area and the non-display area to a first distance, and
a second region being a remainder of the display area except for the first region, the first region completely surrounding the second region, and
a cross-sectional area ratio of the pixel definition layer that a cross-section of the pixel definition layer occupies for a unit pixel is different in the first region and the second region.

2. The organic light emitting diode display as claimed in claim 1, wherein the cross-sectional area ratio of the pixel definition layer of the first region is greater than the cross-sectional area ratio of the pixel definition layer of the second region.

3. The organic light emitting diode display as claimed in claim 2, wherein the cross-sectional area ratio of the pixel definition layer of the first region is greater closer to the non-display area.

4. The organic light emitting diode display as claimed in claim 3, wherein
the first region is divided into a first sub-region, a second sub-region, a third sub-region, and a fourth sub-region, which each extend a second distance in a direction from the boundary of the first region and the second region to the non-display area, and
the cross-sectional area ratio of the pixel definition layer is greater closer to the fourth sub-region than to the first sub-region.

5. The organic light emitting diode display as claimed in claim 4, wherein the second distance is about 5 mm.

6. The organic light emitting diode display as claimed in claim 4, wherein the cross-sectional area ratio of the pixel definition layer of the first sub-region is about 29.5%.

7. The organic light emitting diode display as claimed in claim 4, wherein the cross-sectional area ratio of the pixel definition layer of the second sub-region is about 30.5%.

8. The organic light emitting diode display as claimed in claim 4, wherein the cross-sectional area ratio of the pixel definition layer of the third sub-region is about 31.5%.

9. The organic light emitting diode display as claimed in claim 4, wherein the cross-sectional area ratio of the pixel definition layer of the fourth sub-region is about 32.5%.

10. An organic light emitting diode display comprising:
a substrate including a display area displaying an image and a non-display area positioned at a circumference of the display area;
a thin film transistor on the substrate;
a first electrode on the thin film transistor and electrically connected to the thin film transistor;
a pixel definition layer on the first electrode and defining a pixel area; and
an emission layer on the first electrode and contacting the first electrode in the pixel area,
wherein the display area is divided into
a first region from a boundary of the display area and the non-display area to a first distance, and
a second region being a remainder of the display area except for the first region, and
a cross-sectional area ratio of the pixel definition layer that a cross-section of the pixel definition layer occupies for a unit pixel is different in the first region and the second region, wherein the cross-sectional area ratio of the pixel definition layer of the first region ranges from about 29% to about 33%.

11. The organic light emitting diode display as claimed in claim 10, wherein the cross-sectional area ratio of the pixel definition layer of the second region is less than about 29%.

12. An organic light emitting diode display comprising:
a substrate including a display area displaying an image and a non-display area positioned at a circumference of the display area;
a thin film transistor on the substrate;
a first electrode on the thin film transistor and electrically connected to the thin film transistor;
a pixel definition layer on the first electrode and defining a pixel area; and
an emission layer on the first electrode and contacting the first electrode in the pixel area,
wherein the display area is divided into
a first region from a boundary of the display area and the non-display area to a first distance, and
a second region being a remainder of the display area except for the first region, and
a cross-sectional area ratio of the pixel definition layer that a cross-section of the pixel definition layer occupies for a unit pixel is different in the first region and the second region, wherein the first distance ranges from about 20 mm to about 40 mm.

13. The organic light emitting diode display as claimed in claim 1, wherein the first region of the display area extends only along an inner circumference of the non-display area.

* * * * *